United States Patent
Tay et al.

(10) Patent No.: US 7,173,342 B2
(45) Date of Patent: Feb. 6, 2007

(54) METHOD AND APPARATUS FOR REDUCING ELECTRICAL INTERCONNECTION FATIGUE

(75) Inventors: Cheng Siew Tay, Penang (MY); Swee Kian Cheng, Kedah (MY); Eng Huat Goh, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/322,308

(22) Filed: Dec. 17, 2002

(65) Prior Publication Data
US 2004/0113285 A1 Jun. 17, 2004

(51) Int. Cl.
*H01L 23/485* (2006.01)
(52) U.S. Cl. .................. 257/786; 257/738; 257/698
(58) Field of Classification Search ............. 257/786, 257/738, 698
See application file for complete search history.

(56) References Cited

U.S. PATENT DOCUMENTS

| | | | |
|---|---|---|---|
| 5,872,399 A | 2/1999 | Lee | |
| 5,982,632 A * | 11/1999 | Mosley et al. | 361/775 |
| 6,740,971 B2 * | 5/2004 | Brooks et al. | 257/738 |
| 6,982,486 B2 * | 1/2006 | Brooks et al. | 257/738 |
| 7,078,823 B2 * | 7/2006 | Thurgood | 257/786 |
| 7,102,217 B2 * | 9/2006 | Thurgood | 257/673 |
| 2004/0113285 A1 * | 6/2004 | Tay et al. | 257/786 |
| 2004/0201111 A1 * | 10/2004 | Thurgood | 257/782 |

* cited by examiner

*Primary Examiner*—Laura M. Schillinger
(74) *Attorney, Agent, or Firm*—Schwabe, Williamson & Wyatt, P.C.

(57) ABSTRACT

A method and apparatus is provided that pertains to resisting crack initiation and propagation in electrical interconnections between components and substrates in ball grid array microelectronic packages. A hybrid of dielectric defined and non-dielectric defined electrical interconnects reduces the potential for electrical interconnection failure without having to control the dielectric defined interconnect ratio of substrates. In addition selective orientation of the dielectric defined edge portion of the electrical interconnect away from the point where cracks initiate resists crack propagation and component failure.

8 Claims, 5 Drawing Sheets

METHOD AND APPARATUS FOR REDUCING ELECTRICAL INTERCONNECTION FATIGUE

FIELD OF THE INVENTION

The present invention relates to microelectronic packaging and, more particularly to reducing fatigue and crack propagation in the electrical interconnections of ball grid array packaging.

BACKGROUND OF INVENTION

The demand for reduced size and increased complexity of electronic components has driven the industry to produce smaller and more complex integrated circuits. These same trends have forced the development of microelectronic packages having smaller footprints, higher lead counts, and better electrical and thermal performance. Ball grid arrays (BGA) were developed in part to meet the demand for microelectronic packages having higher lead counts and smaller footprints.

FIG. 1 is a cross sectional view of an example of a BGA microelectronic package, which commonly consists of microelectronic die 14 electrically interconnected with a carrier substrate 12, and one or more other elements, such as electrical interconnects, a die lid, a heat dissipation device, among others (not shown). Carrier substrate 12 contains an array of substrate interconnects 18 that have electrically conductive interconnect material 22 coupled thereon. Interconnect material 22 is typically a solder, but can be any reflowable electrically conductive material. Substrate interconnects 18 are configured into an array to electrically interconnect with a corresponding array of system substrate interconnects 20 of a system substrate 16. An example of a system substrate 16 is a printed circuit board (PCB), which, in some applications, is referred to as a motherboard.

Conventionally, a dielectric material 24 is used as a means for defining electrical interconnects 18 or 20 and for the implantation of interconnect material 22 on the substrate interconnects 18. Though not shown, interconnect material 22 can be coupled to system substrate interconnects 20. The dielectric material, also known as solder mask or solder resist, functions to prevent the interconnect material 22 from migrating to areas where it is not desired, prevents bridging and defines the contact pad surface for which the interconnect material 22 is deposited for electrical interconnection with a substrate. Defining the substrate interconnect in this manner is known as a dielectric defined interconnect, or solder mask defined interconnect.

FIG. 2A is a top view of a dielectric defined interconnect. Dielectric 24 covers a conductive trace 26 and the outer edge of substrate interconnect 18, thereby defining an exposed interconnect portion 28 upon which interconnect material 22 (not shown) is coupled. FIG. 2B is a cross sectional view of a dielectric defined interconnect taken along the line 2B—2B of FIG. 2A. Dielectric 24 creates an opening to the exposed interconnect portion 28, upon which the interconnect material 22 is deposited. The dielectric defined edge 30 creates a stress concentration point, which can initiate cracking or cause fatigue in the electrical interconnection. There is a propensity for the electrical interconnection between the system substrate 16 and the carrier substrate 12 at a point below the die 14 to fatigue or crack before electrical interconnections outside the die perimeter. This propensity for crack initiation is on both the microelectronic package side and the system substrate side, and is due to the coefficient of thermal expansion (CTE) mismatch between the die 14 and carrier substrate 12 during temperature cycling.

Another microelectronic package interconnect design for BGAs is known in the art as a non-dielectric defined interconnect or non-solder mask defined interconnect. An example of a non-dielectric defined interconnect 32 is shown in FIGS. 3A and 3B. As seen in FIG. 3A, the dielectric 24 does not define the interconnect edge 31, but is a slight distance away at 33, which results in the metal of the substrate defining the interconnect edge of a non-dielectric defined interconnect 32.

FIG. 3B is a cross section of FIG. 3A. As shown, the non-dielectric defined interconnect 32 typically results in a stronger electrical interconnection that is less susceptible to fatigue or cracking because there is no dielectric edge (30 in FIG. 2B with respect to a dielectric defined interconnect) engaging the electrical interconnection, which may prevent a stress concentration point. The non-dielectric defined interconnect has drawbacks, however, such as, higher manufacturing costs and higher bridging potential compared to a dielectric defined interconnect.

Several failure patterns are observed in dielectric defined electrical interconnects, particularly those under or directly opposite the die 14 (see FIG. 1). First the dielectric defined interconnect size to system substrate interconnect size ratio can dictate where cracks initiate (i.e. on the system substrate side or the microelectronic package side). Where the ratio is small the electrical interconnection failure tends to be on the microelectronic package side of the electrical interconnection; whereas for larger ratios, the failure tends to be at the system substrate side of the electrical interconnection. This failure has been reduced by optimizing the dielectric opening to interconnect size ratio, which previously was not a critical parameter.

A second failure pattern in dielectric defined interconnects involves the crack initiation point and crack propagation. FIGS. 4A and 4B show the crack initiation and propagation patterns for failing electrical interconnections on both the system substrate 16 side (system substrate side) and the microelectronic package carrier substrate 12 side (microelectronic package side), respectively. FIG. 4A shows the crack initiation point 34 at the system substrate side as being on the outside edge of the electrical interconnection distal to the center portion 36. Cracking generally propagates from the electrical interconnects farthest from the center portion 36 toward the center portion 36 as shown by inward crack propagation arrows 40. FIG. 4B shows the crack initiation point 34' being on the inside edge of the electrical interconnection proximal to the center 36' and the propagation of cracks move outward from the center portion 36', as shown by outward crack propagation arrows 40'. The opposite crack initiation and propagation pattern between the electrical interconnection on the system substrate level versus the microelectronic package level is due to the shear stress caused by the CTE mismatch.

Accordingly new configurations and methods are needed for providing BGA interconnects that resists the cracking tendencies of the electrical interconnections, including crack initiation and crack propagation.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Figure 1:
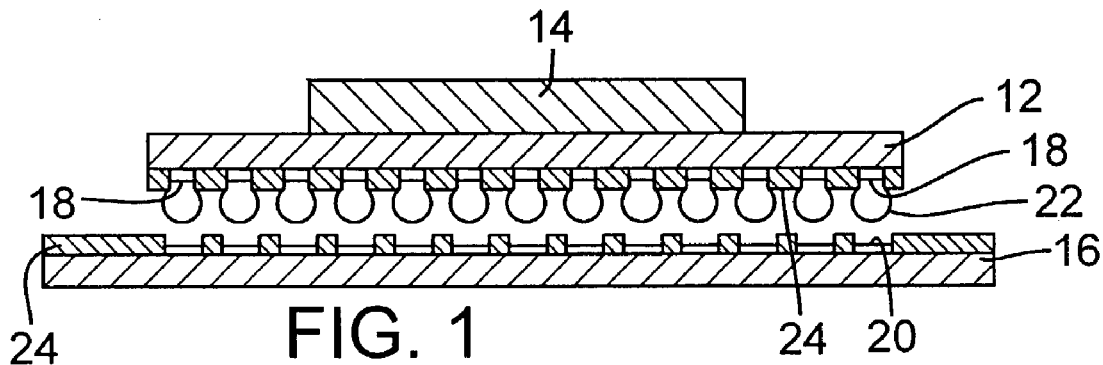
FIG. 1 is a cross-sectional view of an example microelectronic package electrically interconnected to a system substrate.
Figure 2A:
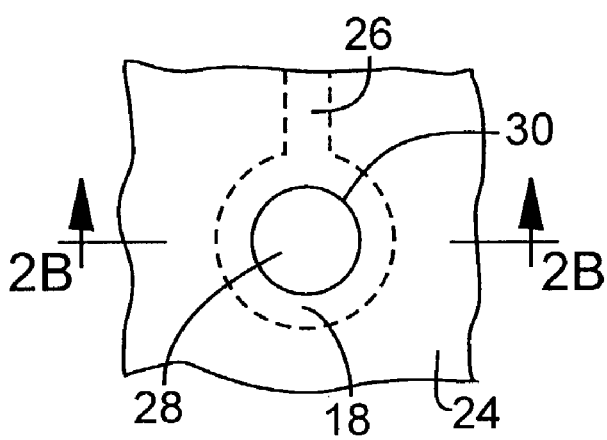
FIG. 2A is a top view of a portion of a dielectric defined ball grid array.
Figure 2B:
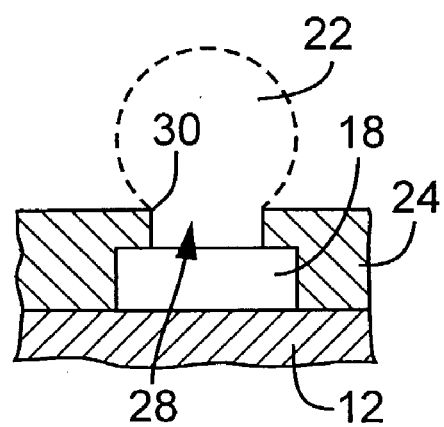
FIG. 2B is a cross section of the dielectric defined ball grid array of FIG. 2A.
Figure 3A:
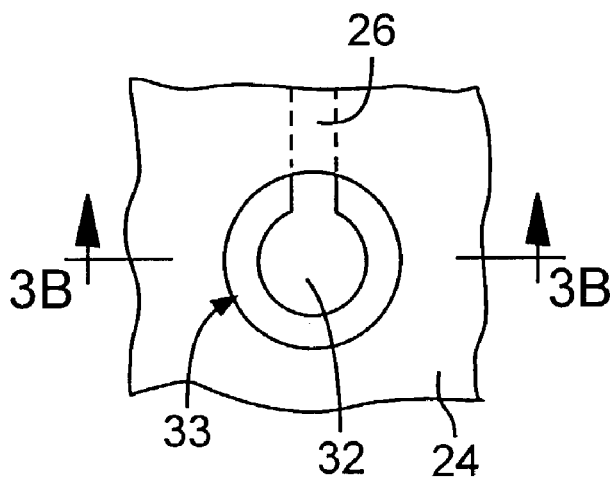
FIG. 3A is a top view of a portion of a non-dielectric defined ball grid array.
Figure 3B:
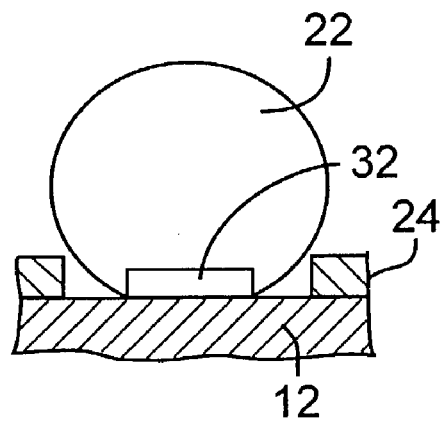
FIG. 3B is a cross section of the dielectric defined ball grid array of FIG. 3A.
Figure 4A:
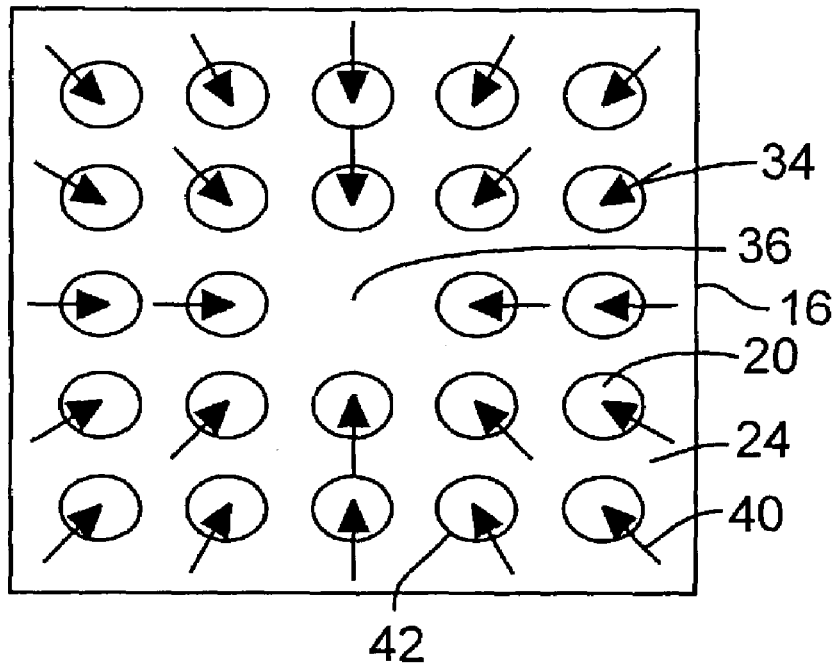
FIG. 4A is a diagram of observed electrical interconnection inward crack propagation pattern and crack initiation at the system substrate side.
Figure 4B:
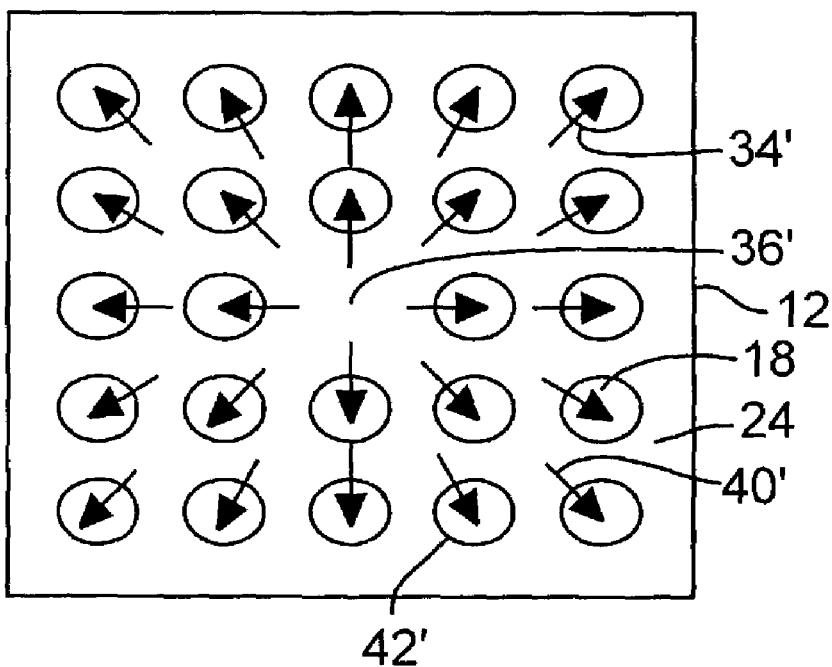
FIG. 4B is a diagram of observed electrical interconnection outward crack propagation pattern and crack initiation at the carrier substrate side.

As previously discussed, FIG. 4A depicts the inward crack propagation pattern and crack initiation of dielectric defined system substrate interconnects 20 on the system substrate 16 side of the electrical interconnection and FIG. 4B depicts the outward crack propagation pattern and crack initiation of dielectric defined substrate interconnects 18 on the microelectronic package level 12 of the electrical interconnection. It has been found that a hybrid of the dielectric defined and non-dielectric defined electrical interconnects strengthen the electrical interconnection at the crack initiation point 34 or 34' can reduce cracking of the electrical interconnection and resist the crack propagation 40 and 40'.

Figure 5A:
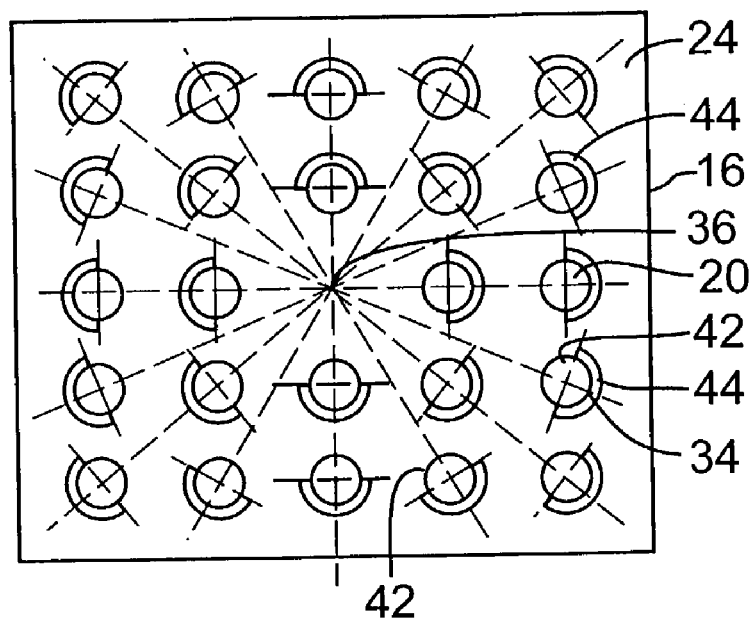
FIG. 5A is a top view of an embodiment of system substrate side electrical interconnects in accordance with the present invention.

FIG. 5A is a top view of an embodiment of the under die portion of the system substrate side that electrically interconnects with the carrier substrate of a microelectronic package in accordance with the present invention. The system substrate interconnect 20 is a hybrid, being partially dielectric defined and partially non-dielectric defined. Dielectric 24 covers system substrate 16 and interfaces with the system substrate interconnect 20 on the inner edge portion proximal to center portion 36 of system substrate 16, which creates a dielectric defined interconnect edge portion 42. The outer edge portion of the system substrate interconnect 20 is non-dielectric defined interconnect edge portion, which creates a non-dielectric defined interconnect edge portion 44 that can help prevent crack initiation at the typical crack initiation point 34.

Figure 5B:
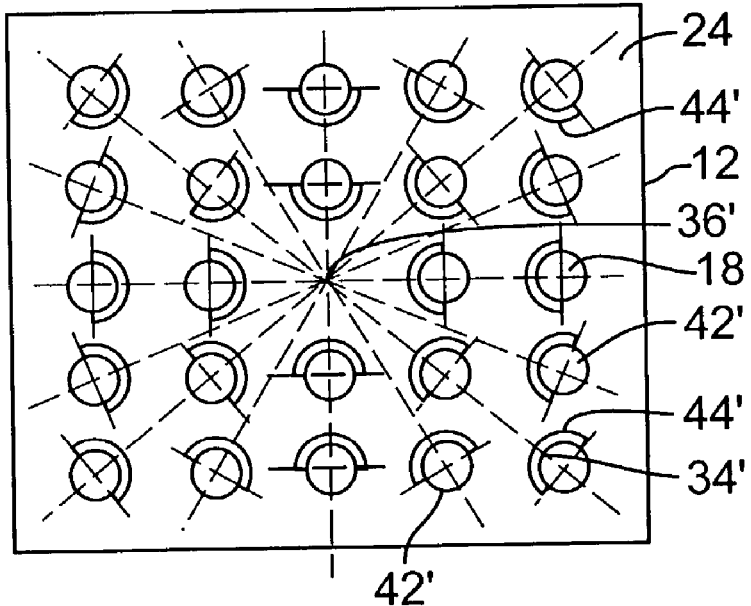
FIG. 5B is a top view of an embodiment of microelectronic package side electrical interconnects in accordance with the present invention.

FIG. 5B is a top view of an embodiment of the under die portion of the microelectronic package side 12 that electrically interconnects with a system substrate in accordance with the present invention. The substrate interconnect 18 is a hybrid, being partially dielectric defined and partially non-dielectric defined. Dielectric 24 covers carrier substrate 12 and interfaces with the substrate interconnect 18 on the outer edge portion if substrate interconnect 18 distal to the center 36', which creates dielectric defined interconnect edge portion 42'. The inner edge portion of substrate interconnect 18 is then a non-dielectric defined interconnect edge portion 44', which can help prevent crack initiation at the typical crack initiation point 34'.

Figure 5C:
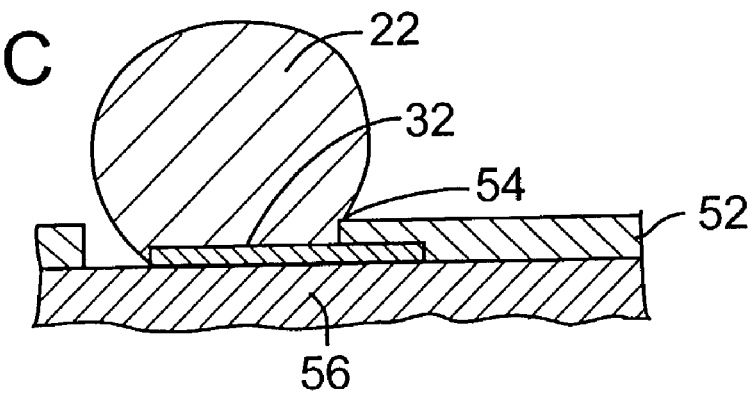
FIG. 5C is a side view of an embodiment of a hybrid electrical interconnect in accordance with the present invention.

FIG. 5C is a cross section of a hybrid electrical interconnect in accordance with the present invention. Electrical interconnect 50 is a hybrid in accordance with the present invention, being partially dielectric defined and partially non-dielectric defined. A portion of electrical interconnect 50 is defined by dielectric 52, which results in stress concentration point 54 in interconnect material 22. The remaining portion of electrical interconnect 50 is not defined by dielectric 52, but is defined by the metal of substrate 56 such that there is a reduced stress concentration point.

Figure 6A:
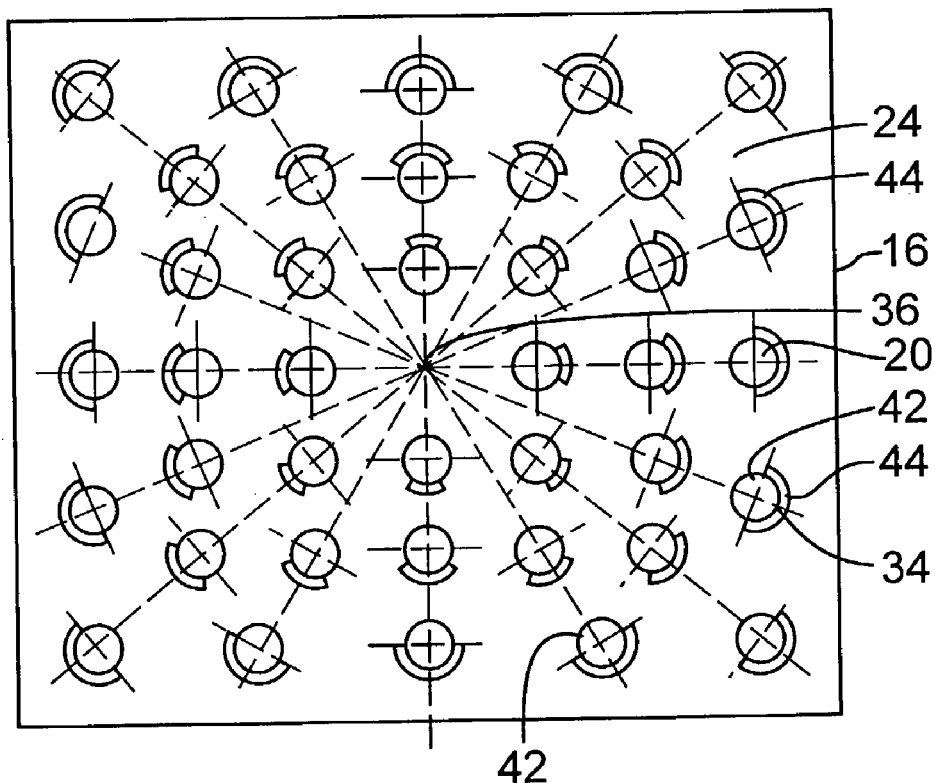
FIG. 6A is a top view of another embodiment of system substrate side electrical interconnects in accordance with the present invention.

Though FIGS. 5A and 5B depict approximately a one to one ratio of non-dielectric defined interconnect edge portion 44 and 44' to dielectric defined interconnect edge portion 42 and 42', this ratio can vary depending on the electrical interconnection strength required to resist cracking at the crack initiation point 34 and 34' (see FIGS. 4A and 4B). FIG. 6A depicts another embodiment in accord with the present invention, where the ratio of non-dielectric defined interconnect edge portion 44 to dielectric defined interconnect edge portion 42 can vary depending on the location of the system substrate interconnect 20 with respect to center 36. Knowing that on the system substrate side the electrical interconnection cracking propagates from the outer system substrate interconnects 20 inward toward the center 36, the non-dielectric defined interconnect edge portion 44 to dielectric defined edge portion 46 ratio can be higher on the electrical interconnects 20 that are farthest away from the center 36. The ratio can be lower for the system substrate interconnects 20 that are closer to the center 36 due to the shear stress shifting to the microelectronic package side substrate electrical interconnects 18 (not shown in FIG. 6A, but shown in FIG. 6B).

Figure 6B:
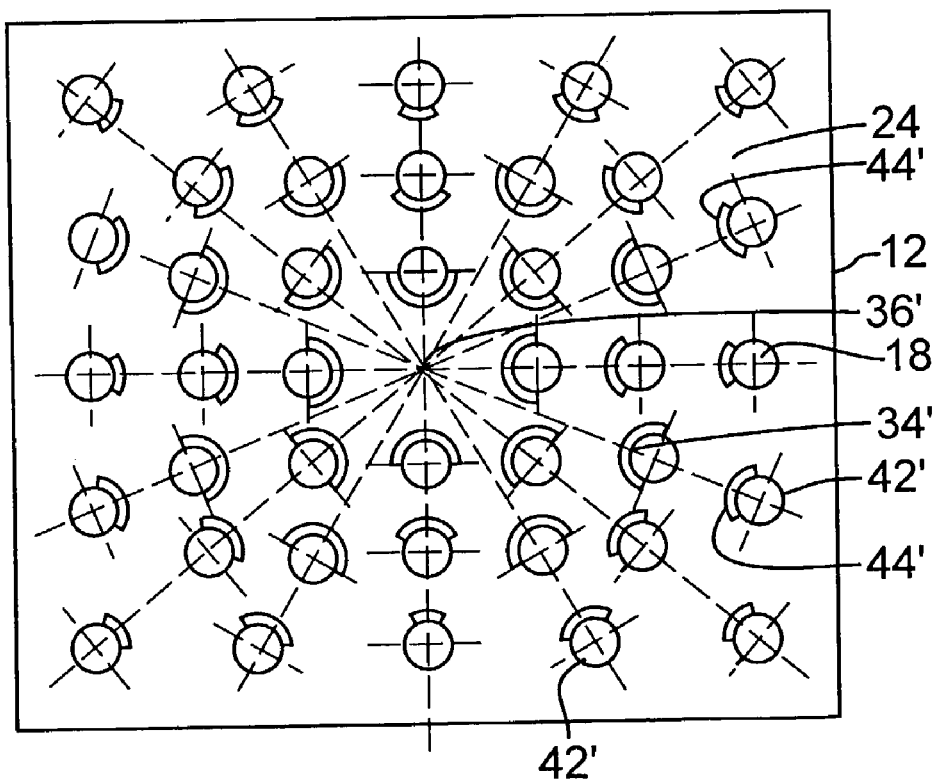
FIG. 6B is a top view of another embodiment of microelectronic package side electrical interconnects in accordance with the present invention.

FIG. 6B shows another embodiment in accordance with the present invention, where the ratio of non-dielectric defined edge to dielectric defined edge on the microelectronic package side decreases the more distal substrate interconnect 18 is from the center 36', as the shear stress concentration shifts to the system substrate side electrical interconnects (not shown). Other parameters also can impact the non-dielectric defined to dielectric defined ratio, which include, but are not limited to, process costs and microelectronic package size.

Referring again to FIGS. 5A and 5B, regardless of the ratio of the non-dielectric defined interconnect edge portion 44 and 44' to the dielectric defined interconnect edge portion 42 and 42', the non-dielectric defined interconnect edge portion 44 and 44' should be oriented toward the edge of electrical interconnects 20 and 18 at the potential crack initiation point 34 and 34'. Selective orientation of the non-dielectric defined interconnect edge 44 and 44' and the dielectric defined interconnect edge portion 42 and 42' can resists the crack propagation pattern (shown in FIGS. 4 and 4A by arrows 40 and 40' respectively). As shown in FIGS. 5A and 6A, to resist inward crack propagation on the system substrate side 16, the non-dielectric defined interconnect edge portion 44 can be oriented distal to the center 36. As shown in FIGS. 5B and 6B, to resist outward crack propagation on the microelectronic package side, the non-dielectric defined interconnect edge portion 44' is oriented proximal to the center 36'.

Though the above embodiments have been described in relation to electrically interconnecting a microelectronic package substrate 12 to a system substrate 16, the same apply to electrically interconnecting substrates where a CTE mismatch exists between the substrates.

Figure 7:
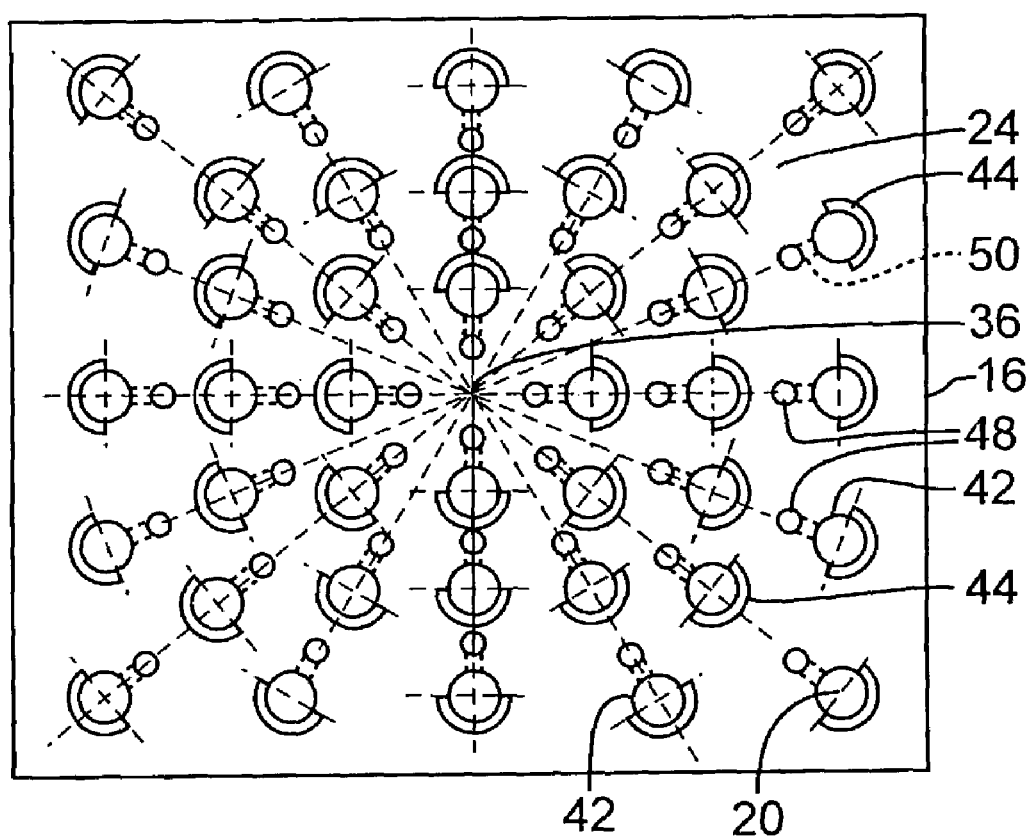
FIG. 7 is a top view of another embodiment in accordance with the present invention with vias.

FIG. 7 illustrates another embodiment of the present invention where the system substrate interconnects 20 include vias 48. Via 48 comprises electrically conductive material that electrically connects circuit traces on different layers (not shown) of system substrate 16. Via 48 can be of any type or cross-section but are commonly tubular, and can extend partially into system substrate 16 or entirely through, depending upon how many layers of the system substrate 16 it is required to interconnect with.

Dielectric 24 is applied to the substrate 16. As with the embodiment described in reference to FIG. 5A, to resist crack initiation and propagation, a non-dielectric defined interconnect edge portion 44 of the system substrate interconnect 20 is oriented distal to the center 36. Via 48 is oriented between the system substrate interconnect 20 and center portion 36. An electrically conductive trace 50 connects via 48 to system substrate interconnect 20. Dielectric 24 covers the conductive trace 50, leaving the opening of the via exposed. Further, as with the embodiment described in FIG. 5, but not shown, the ratio of non-dielectric defined to dielectric defined interconnect edge portions, 44 and 42 respectively, can be varied depending on the factors identified above.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A substrate, comprising:
an array having a plurality of electrical interconnects on a surface of the substrate, the array having an outer portion and a center; and
a dielectric layer, wherein the dielectric layer covers a portion of the surface of the substrate and contacts no more than a portion of an edge of at least one of the electrical interconnects to define a dielectric electrical interconnect edge portion and a non-dielectric electrical interconnect edge portion, the non-dielectric electrical interconnect edge portion being oriented on the surface of the substrate to resist crack propagation.

2. The substrate of claim 1, wherein the non-dielectric electrical interconnect edge portion is oriented distal to the center to resist inward crack propagation.

3. The substrate of claim 1, wherein the non-dielectric electrical interconnect edge portion is oriented proximal to the center to resist outward crack propagation.

4. The substrate of claim 1, wherein the ratio of the dielectric defined edge portion to the non-dielectric defined edge portion is greater than one.

5. The substrate of claim 1, wherein the ratio of the dielectric defined edge portion to the non-dielectric defined edge portion is less than one.

6. The substrate of claim 1, further comprising a corresponding via and a corresponding linking interconnect for each electrical interconnect, the electrical interconnect being spaced apart from the corresponding via a predetermined distance, the corresponding linking interconnect electrically interconnecting the electrical interconnect to the corresponding via.

7. The substrate of claim 6, wherein the corresponding via is oriented between the electrical interconnect and the center of the array.

8. The substrate of claim 6, wherein the electrical interconnect is oriented between the corresponding via and the center of the array.

* * * * *